(12) United States Patent
Shi et al.

(10) Patent No.: US 11,608,451 B2
(45) Date of Patent: Mar. 21, 2023

(54) SHALLOW TRENCH ISOLATION (STI) CHEMICAL MECHANICAL PLANARIZATION (CMP) POLISHING WITH TUNABLE SILICON OXIDE AND SILICON NITRIDE REMOVAL RATES

(71) Applicant: Versum Materials US, LLC, Tempe, AZ (US)

(72) Inventors: Xiaobo Shi, Chandler, AZ (US); Krishna P. Murella, Phoenix, AZ (US); Joseph D. Rose, Gilbert, AZ (US); Hongjun Zhou, Chandler, AZ (US); Mark Leonard O'Neill, Queen Creek, AZ (US)

(73) Assignee: VERSUM MATERIALS US, LLC, Tempe, AZ (US)

( * ) Notice: Subject to any disclaimer, the term of this patent is extended or adjusted under 35 U.S.C. 154(b) by 0 days.

(21) Appl. No.: 16/737,417

(22) Filed: Jan. 8, 2020

(65) Prior Publication Data
US 2020/0239736 A1 Jul. 30, 2020

Related U.S. Application Data

(60) Provisional application No. 62/798,638, filed on Jan. 30, 2019.

(51) Int. Cl.
| | | |
|---|---|---|
| *C09G 1/02* | (2006.01) | |
| *H01L 21/3105* | (2006.01) | |
| *H01L 21/762* | (2006.01) | |
| *C09G 1/00* | (2006.01) | |
| *C09K 3/14* | (2006.01) | |
| *H01L 21/306* | (2006.01) | |

(52) U.S. Cl.
CPC .............. *C09G 1/02* (2013.01); *C09G 1/00* (2013.01); *C09K 3/14* (2013.01); *C09K 3/1454* (2013.01); *C09K 3/1463* (2013.01); *H01L 21/30625* (2013.01); *H01L 21/31053* (2013.01); *H01L 21/76224* (2013.01)

(58) Field of Classification Search
None
See application file for complete search history.

(56) References Cited

U.S. PATENT DOCUMENTS

| | | | |
|---|---|---|---|
| 5,876,490 A | 3/1999 | Ronay | |
| 6,544,892 B2 | 4/2003 | Srinivasan et al. | |
| 6,616,514 B1 | 9/2003 | Edelbach et al. | |
| 6,914,001 B2 | 7/2005 | Lee et al. | |
| 6,964,923 B1 | 11/2005 | Ronay | |
| 6,984,588 B2 | 1/2006 | Grover et al. | |
| 7,247,082 B2 | 7/2007 | Yoshida et al. | |
| 8,778,203 B2 | 7/2014 | Dandu et al. | |
| 2002/0025762 A1* | 2/2002 | Luo | C09G 1/02 451/41 |
| 2004/0152309 A1 | 8/2004 | Carter et al. | |
| 2012/0077419 A1 | 3/2012 | Zhang et al. | |
| 2016/0108284 A1* | 4/2016 | Yoshizaki | C09K 3/1463 252/79.1 |
| 2016/0200944 A1 | 7/2016 | Zhou et al. | |
| 2016/0358790 A1* | 12/2016 | Shi | H01L 21/67092 |
| 2017/0088748 A1 | 3/2017 | Stender et al. | |
| 2017/0283673 A1* | 10/2017 | Zhou | B24B 37/044 |
| 2018/0105428 A1* | 4/2018 | Tawarazako | C09K 3/14 |
| 2018/0244955 A1 | 8/2018 | Henry et al. | |
| 2020/0024481 A1 | 1/2020 | Doi et al. | |

FOREIGN PATENT DOCUMENTS

| | | |
|---|---|---|
| CN | 101302404 A | 11/2008 |
| EP | 1724819 A | 11/2006 |
| JP | 2004055861 A | 2/2004 |
| KR | 20050122754 | 12/2005 |
| KR | 100851235 B1 | 8/2008 |
| TW | 201412963 A | 4/2014 |
| TW | 201506100 A | 2/2015 |
| TW | 201736567 A | 10/2017 |
| WO | 06001558 A1 | 1/2006 |
| WO | 2010139603 A1 | 12/2010 |
| WO | 2013035034 A1 | 3/2013 |
| WO | 2013093557 A1 | 6/2013 |
| WO | 2013118015 A1 | 8/2013 |
| WO | 2016/159167 | * 10/2016 |

OTHER PUBLICATIONS

Borujeny, E. R. et al., Ceria coated silica particles: One step preparation and settling behaviour under the influence of colloidal and hydrodynamic interactions. Materials Chemistry and Physics, Apr. 15, 2016, vol. 173, pp. 467-474.

* cited by examiner

*Primary Examiner* — Stephanie P Duclair
(74) *Attorney, Agent, or Firm* — Lina Yang

(57) ABSTRACT

Shallow Trench Isolation (STI) chemical mechanical planarization (CMP) polishing compositions, methods and systems of use therefore are provided. The CMP polishing composition comprises abrasives of ceria coated inorganic metal oxide particles, such as ceria-coated silica; and dual chemical additives for providing the tunable oxide film removal rates and tunable SiN film removal rates. Chemical additives comprise at least one nitrogen-containing aromatic heterocyclic compound and at least one non-ionic organic molecule having more than one hydroxyl functional group organic.

18 Claims, No Drawings

SHALLOW TRENCH ISOLATION (STI) CHEMICAL MECHANICAL PLANARIZATION (CMP) POLISHING WITH TUNABLE SILICON OXIDE AND SILICON NITRIDE REMOVAL RATES

CROSS REFERENCE TO RELATED PATENT APPLICATIONS

The application claims the benefit of U.S. Application No. 62/798,638 filed on Jan. 30, 2019. The disclosure of Application No. 62/798,638 is hereby incorporated by reference.

BACKGROUND OF THE INVENTION

This invention relates to the STI CMP chemical polishing compositions and chemical mechanical planarization (CMP) for Shallow Trench Isolation (STI) process.

In the fabrication of microelectronics devices, an important step involved is polishing, especially surfaces for chemical-mechanical polishing for recovering a selected material and/or planarizing the structure.

For example, a SiN layer is deposited under a $SiO_2$ layer to serve as a polish stop layer. The role of such polish stop is particularly important in Shallow Trench Isolation (STI) structures. Selectivity is characteristically expressed as the ratio of the oxide polish rate to the nitride polish rate. An example is the tunable polishing selectivity rate of silicon dioxide ($SiO_2$) as compared to silicon nitride (SiN).

In the global planarization of patterned STI structures, tuning SiN film removal rates and tuning oxide trench dishing are two key factors to be considered. The lower trench oxide loss will prevent electrical current leaking between adjacent transistors. Non-uniform trench oxide loss across die (within Die) will affect transistor performance and device fabrication yields. Severe trench oxide loss (high oxide trench dishing) will cause poor isolation of transistor resulting in device failure. Therefore, it is also important to reduce trench oxide loss by reducing oxide trench dishing in STI CMP polishing compositions.

U.S. Pat. No. 5,876,490 discloses the polishing compositions containing abrasive particles and exhibiting normal stress effects. The slurry further contains non-polishing particles resulting in reduced polishing rate at recesses, while the abrasive particles maintain high polish rates at elevations. This leads to improved planarization. More specifically, the slurry comprises cerium oxide particles and polymeric electrolyte, and can be used for Shallow Trench Isolation (STI) polishing applications.

U.S. Pat. No. 6,964,923 teaches the polishing compositions containing cerium oxide particles and polymeric electrolyte for Shallow Trench Isolation (STI) polishing applications. Polymeric electrolyte being used includes the salts of polyacrylic acid, similar as those in U.S. Pat. No. 5,876,490. Ceria, alumina, silica & zirconia are used as abrasives. Molecular weight for such listed polyelectrolyte is from 300 to 20,000, but in overall, <100,000.

U.S. Pat. No. 6,616,514 discloses a chemical mechanical polishing slurry for use in removing a first substance from a surface of an article in preference to silicon nitride by chemical mechanical polishing. The chemical mechanical polishing slurry according to the invention includes an abrasive, an aqueous medium, and an organic polyol that does not dissociate protons, said organic polyol including a compound having at least three hydroxyl groups that are not dissociable in the aqueous medium, or a polymer formed from at least one monomer having at least three hydroxyl groups that are not dissociable in the aqueous medium.

U.S. Pat. No. 6,984,588 discloses a chemical mechanical polishing composition comprising a soluble cerium compound at a pH above 3 and a method to selectively polish a silicon oxide overfill in preference to a silicon nitride film layer in a single step during the manufacture of integrated circuits and semiconductors.

U.S. Pat. No. 6,544,892 discloses a method of removing silicon dioxide in preference to silicon nitride from a surface of an article by chemical-mechanical polishing comprising polishing said surface using a polishing pad, water, abrasive particles, and an organic compound having both a carboxylic acid functional group and a second functional group selected from amines and halides.

U.S. Pat. No. 7,247,082 discloses a polishing composition comprising an abrasive, a pH adjusting agent, an improver of a selective ratio, and water, wherein the abrasive is contained in an amount of from 0.5 to 30% by weight, the pH adjusting agent is contained in an amount of from 0.01 to 3% by weight, the improver of a selective ratio is contained in an amount of 0.3 to 30% by weight, and water is contained in an amount of 45 to 99.49% by weight, wherein the weight % is based on the weight of the polishing composition, and wherein the improver is one or more compounds selected from the group consisting of methylamine, ethylamine, propylamine, isopropyl amine, dimethylamine, diethylamine, dipropylamine, diisopropylamine, ethylenediamine, 1,2-diaminopropane, 1,3-propanediamine, 1,4-butanediamine, hexamethylenediamine, N,N,N',N'-tetramethyl-1,6-diaminohexane, 6-(dimethylamino)-1-hexanol, bis(3-aminopropyl)amine, triethylenetetramine, diethylene glycol bis(3-aminopropyl) ether, piperazine, and piperidine.

U.S. Pat. No. 8,778,203 discloses a method for selectively removing a target material on a surface of a substrate, the method comprising the steps of: providing a substrate comprising a target material and a non-target material; dissolving oxygen in a polishing solution to achieve a pre-determined dissolved oxygen concentration, the polishing solution having a pH of from about 5 to about 11, wherein the polishing solution comprises a plurality of abrasive silica particles, at least some of said plurality of abrasive silica particles are functionalized with n-(trimethoxysilylpropyl)isothiouronium chloride; maintaining, by continuously applying substantially pure oxygen to said polishing solution, the pre-determined dissolved oxygen concentration of said polishing solution at or between approximately 8.6 mg/L and approximately 16.6 mg/L; disposing the polishing solution between a polishing pad and the surface; applying the polishing pad to the surface; and selectively removing a predetermined thickness of the target material; wherein varying the dissolved oxygen content of the polishing solution varies the removal ratio of target material to non-target material during the removal step.

U.S. Pat. No. 6,914,001 discloses s chemical mechanical polishing method comprising: contacting a surface of a semiconductor wafer with a surface of a polishing pad; supplying an aqueous solution containing abrasive particles, a removal rate accelerator, and different first and second passivation agents to an interface between the surface of the polishing pad and the surface of the semiconductor wafer, wherein the first passivation agent is an anionic, cationic or nonionic surfactant; and, rotating the surface of the semiconductor wafer relative to the surface of the polishing pad to remove an oxide material on the semiconductor wafer.

However, those prior disclosed Shallow Trench Isolation (STI) polishing compositions did not address the importance of oxide film removal rate tuning, SiN film removal rate tuning and oxide trench dishing reducing and more uniform oxide trench dishing on the polished patterned wafers along with the tunable oxide vs nitride selectivity.

Therefore, it should be readily apparent from the foregoing that there remains a need within the art for compositions, methods and systems of STI chemical mechanical polishing that can afford the tunable oxide film removal rates, the tunable SiN film removal rates and the reduced oxide trench dishing and more uniformed oxide trench dishing across various sized oxide trench features on polishing patterned wafers in a STI chemical and mechanical polishing (CMP) process.

SUMMARY OF THE INVENTION

The present invention provides STI CMP polishing compositions for the tunable oxide film removal rates with the use of relative low concentrations of ceria-coated inorganic oxide abrasives, the tunable SiN film removal rates and the tunable TEOS:SiN selectivity and the reduced oxide trench dishing on the polished patterned wafers.

The present invented STI CMP polishing compositions provides tunable oxide vs nitride selectivity by introducing dual chemical additives for tuning oxide and SiN film removal rates and reducing oxide trenching dishing in the chemical mechanical polishing (CMP) compositions for Shallow Trench Isolation (STI) CMP applications at wide pH range including acidic, neutral and alkaline pH conditions.

The disclosed chemical mechanical polishing (CMP) compositions for Shallow Trench Isolation (STI) CMP applications have a unique combination of using ceria-coated inorganic oxide abrasive particles and the suitable dual chemical additives as oxide film and nitride film removal rate tuning agents, and oxide trench dishing reducing agents.

In one aspect, there is provided a chemical mechanical polishing composition comprising: at least one ceria-coated inorganic oxide particles; at least one nitrogen-containing aromatic heterocyclic compound; at least one non-ionic organic molecule having more than one hydroxyl functional group; at least one solvent; and optionally, a biocide; and optionally, at least one a pH adjuster, wherein the composition has a pH of from 2 to 12.

In another aspect, there is provided a method of chemical mechanical polishing (CMP) a semiconductor substrate having at least one surface comprising a silicon oxide film, the method comprising the steps of: providing the semiconductor substrate; providing a polishing pad; providing the chemical mechanical polishing (CMP) composition comprising at least one ceria-coated inorganic oxide particles; at least one nitrogen-containing aromatic heterocyclic compound; at least one non-ionic organic molecule having more than one hydroxyl functional group; at least one solvent; and optionally, a biocide; and optionally, at least one a pH adjuster, wherein the composition has a pH of from 2 to 12; contacting the surface of the semiconductor substrate with the polishing pad and the chemical mechanical polishing composition; and polishing the least one surface comprising silicon dioxide.

In yet another aspect, there is provided a system of chemical mechanical polishing (CMP) a semiconductor substrate having at least one surface comprising silicon oxide, the system comprising: a semiconductor substrate; the chemical mechanical polishing (CMP) composition comprising at least one ceria-coated inorganic oxide particles; at least one nitrogen-containing aromatic heterocyclic compound; at least one non-ionic organic molecule having more than one hydroxyl functional group; at least one solvent; and optionally, a biocide; and optionally, at least one a pH adjuster, wherein the composition has a pH of from 2 to 12; a polishing pad, wherein the at least one surface comprising silicon oxide film is in contact with the polishing pad and the chemical mechanical polishing composition.

The polished oxide films can be Chemical vapor deposition (CVD), Plasma Enhance CVD (PECVD), High Density Deposition CVD(HDP), or spin on oxide films.

The substrate disclosed above can further comprises a silicon nitride surface. The removal selectivity of $SiO_2$:SiN is tunable depending on the relevant STI CMP application requirements.

DETAILED DESCRIPTION OF THE INVENTION

In the global planarization of patterned STI structures, tuning SiN removal rates, reducing oxide trench dishing across various sized oxide trench features, tuning oxide film removal rates, and using relative low concentrations of ceria-coated inorganic oxide particles as abrasives are the key factors to be considered.

The lower trench oxide loss will prevent electrical current leaking between adjacent transistors. Non-uniform trench oxide loss across die (within die) will affect transistor performance and device fabrication yields. Severe trench oxide loss (high oxide trench dishing) will cause poor isolation of transistor resulting in device failure. Therefore, it is important to reduce trench oxide loss by reducing oxide trench dishing in STI CMP polishing compositions.

This development relates to Chemical Mechanical Polishing (CMP) compositions using chemical additives and ceria-coated composite particles as abrasives for Shallow Trench Isolation (STI) CMP applications.

More specifically, the disclosed chemical mechanical polishing (CMP) composition for Shallow Trench Isolation (STI) CMP applications have a unique combination of using ceria-coated inorganic metal oxide inorganic oxide abrasive particles and two types of chemical additives as dual chemical additives for oxide film removal rate tuning, oxide trench dishing reducing and nitride removal rate tuning.

Dual chemical additives used in the same STI CMP polishing compositions provide the benefits of achieving desirable oxide film removal rates, tunable SiN film removal rates, and tunable Oxide:SiN selectivity, and more importantly, providing significantly reduced oxide trench dishing and improving over polishing window stability on polishing patterned wafers.

The first chemical additive (also referred to herein as Type I) comprises at least one nitrogen-containing aromatic heterocyclic compound such as, for example, benzotriazole and its derivatives, 2-aminobenzimidazole and its derivatives, amitrole and its derivatives, and triazole and its derivatives.

The second chemical additive (also referred to herein as Type II) comprises at least one non-ionic organic molecule having more than one hydroxyl functional group.

In one aspect, there is provided a STI CMP polishing composition comprises at least one ceria-coated inorganic oxide particles; at least one nitrogen-containing aromatic heterocyclic compound; at least one non-ionic organic molecule having more than one hydroxyl functional group; at least one solvent; and optionally, a biocide; and optionally, at least one a pH adjuster, wherein the composition has a pH of from 2 to 12

The ceria-coated inorganic oxide particles include, but are not limited to, ceria-coated colloidal silica, ceria-coated alumina, ceria-coated titania, ceria-coated zirconia, or any other ceria-coated inorganic oxide particles.

The particle sizes of these ceria-coated inorganic oxide particles in the disclosed invention herein are ranged from 10 nm to 1,000 nm, the preferred mean particle sized are ranged from 20 nm to 500 nm, the more preferred mean particle sizes are ranged from 50 nm to 250 nm.

In some embodiments, the concentrations of these ceria-coated inorganic oxide particles range from 0.01 wt. % to 20 wt. %, the preferred concentrations range from 0.05 wt. % to 10 wt. %, and the more preferred concentrations range from 0.1 wt. % to 5 wt. %.

In some other embodiments, the concentrations of these ceria-coated inorganic oxide particles range from 0.01 wt. % to 2 wt. %, the preferred concentrations range from 0.025 wt. % to 1.0 wt. %, the more preferred concentrations range from 0.05 wt. % to 0.5 wt. %.

The preferred ceria-coated inorganic oxide particles are ceria-coated colloidal silica particles.

The solvent includes but is not limited to deionized (DI) water, distilled water, and alcoholic organic solvents.

The preferred solvent is DI water.

The STI CMP composition may contain a biocide from 0.0001 wt. % to 0.05 wt. %; preferably from 0.0005 wt. % to 0.025 wt. %, and more preferably from 0.001 wt. % to 0.01 wt. %.

The biocide includes, but is not limited to, Kathon™, Kathon™ CG/ICP II, from Dupont/Dow Chemical Co. Bioban from Dupont/Dow Chemical Co. They have active ingredients of 5-chloro-2-methyl-4-isothiazolin-3-one and 2-methyl-4-isothiazolin-3-one.

The STI CMP composition may contain a pH adjusting agent.

An acidic or basic pH adjusting agent can be used to adjust the STI polishing compositions to the optimized pH value.

The pH adjusting agents include, but are not limited to nitric acid, hydrochloric acid, sulfuric acid, phosphoric acid, other inorganic or organic acids, and mixtures thereof.

pH adjusting agents also include the basic pH adjusting agents, such as sodium hydride, potassium hydroxide, ammonium hydroxide, tetraalkyl ammonium hydroxide, organic quaternary ammonium hydroxide compounds, organic amines, and other chemical reagents that can be used to adjust pH towards the more alkaline direction.

The pH of the compositions disclosed herein can be in the range of from 2 to 12, preferably from 3 to 10, and more preferably from 4 to 9.

The STI CMP composition contains 0 wt. % to 1 wt. %, preferably 0.01 wt. % to 0.5 wt. %, and more preferably 0.1 wt. % to 0.25 wt. % pH adjusting agent.

The STI CMP composition contains 0.0001 wt. % to 2.0% wt. %, preferably 0.001 wt. % to 1.0 wt. %, and preferable 0.0025 wt. % to 0.25 wt. % of at least one nitrogen-containing aromatic heterocyclic compound as a chemical additive that functions primarily to tune oxide film removal rates and SiN film removal rates and to reduce oxide trenching dishing.

The STI CMP composition also contains from 0.001 wt. % to 2.0% wt. %, preferably 0.0025 wt. % to 1.0 wt. %, and preferable 0.05 wt. % to 0.5 wt. % of at least one non-ionic organic molecule having more than one hydroxyl functional group that functions primarily as an SiN film removal rate and oxide film removal rate tuning agent and oxide trenching dishing reducers.

The Type I of chemical additives have at least one nitrogen-containing aromatic heterocyclic compound.

The nitrogen-containing aromatic heterocyclic compounds disclosed herein typically have a general molecular structure selected from a group comprising:

(a)

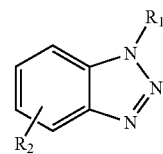

wherein $R_1$ is selected from the group consisting of hydrogen, alkyl groups with straight chain or branched chain, alkoxy groups with straight chain or branched chain, alkene groups with single or multi carbon to carbon double bonds, alkyne groups with single or multi carbon to carbon triple bonds, primary amine groups, secondary amino groups, tertiary amino groups, cationic organic quaternary ammonium groups, —COOH, —SO$_3$H, —H$_2$PO$_4$, —COOR', —COOM (M=Na+, K+ or NH$_4$+), —SO$_3$M (M=Na+, K+ or NH$_4$+), —HPO$_4$M (M=Na+, K+ or NH4+), —PO$_4$M$_2$ (M=Na+, K+ or NH4+), and combinations thereof;

and $R_2$ can be present or not present; $R_2$ is selected from the group consisting of alkyl groups with straight chain or branched chain, alkoxy groups with straight chain or branched chain, alkene groups with single or multi carbon to carbon double bonds, alkyne groups with single or multi carbon to carbon triple bonds, primary amine groups, secondary amino groups, tertiary amino groups, cationic organic quaternary ammonium groups, —COOH, —SO$_3$H, —H$_2$PO$_4$, —COOR', —COOM (M=Na+, K+ or NH$_4$+), —SO$_3$M (M=Na+, K+ or NH$_4$+), —HPO$_4$M (M=Na+, K+ or NH$_4$+), —PO$_4$M$_2$ (M=Na+, K+ or NH$_4$+), and combinations thereof;

(b)

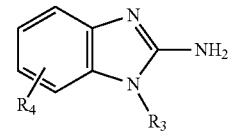

wherein $R_3$ is selected from the group consisting of hydrogen, alkyl groups with straight chain or branched chain, alkoxy groups with straight chain or branched chain, alkene groups with single or multi carbon to carbon double bonds, alkyne groups with single or multi carbon to carbon triple bonds, primary amine groups, secondary amino groups, tertiary amino groups, cationic organic quaternary ammonium groups, —COOH, —SO$_3$H, —H$_2$PO$_4$, —COOR', —COOM (M=Na+, K+ or NH$_4$+), —SO$_3$M (M=Na+, K+ or NH$_4$+), —HPO$_4$M (M=Na+, K+ or NH$_4$+), —PO$_4$M$_2$ (M=Na+, K+ or NH$_4$+), and combinations thereof;
and
R$_4$ can be present or not present; when present, R$_4$ is selected from the group consisting of alkyl groups with straight chain or branched chain, alkoxy groups with straight chain or branched chain, alkene groups with single or multi carbon to carbon double bonds, alkyne groups with single or multi carbon to carbon triple bonds, primary amine groups, secondary amino groups, tertiary amino groups, cationic organic quaternary ammonium groups, —COOH, —SO$_3$H, —H$_2$PO$_4$, —COOR', —COOM (M=Na+, K+ or NH$_4$+), —SO$_3$M (M=Na+, K+ or NH$_4$+), —HPO$_4$M (M=Na+, K+ or NH$_4$+), —PO$_4$M$_2$ (M=Na+, K+ or NH$_4$+), and combinations thereof;
(c)

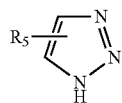

wherein
R$_5$ can be present or not present; R$_5$ is selected from the group consisting of alkyl groups with straight chain or branched chain, alkoxy groups with straight chain or branched chain, alkene groups with single or multi carbon to carbon double bonds, alkyne groups with single or multi carbon to carbon triple bonds, primary amine groups, secondary amino groups, tertiary amino groups, cationic organic quaternary ammonium groups, —COOH, —SO$_3$H, —H$_2$PO$_4$, —COOR', —COOM (M=Na+, K+ or NH$_4$+), —SO$_3$M (M=Na+, K+ or NH$_4$+), —HPO$_4$M (M=Na+, K+ or NH$_4$+), —PO$_4$M$_2$ (M=Na+, K+ or NH$_4$+), and combinations thereof;
(d)

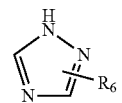

wherein
R$_6$ can be present or not present; R$_6$ is selected from the group consisting of alkyl groups with straight chain or branched chain, alkoxy groups with straight chain or branched chain, alkene groups with single or multi carbon to carbon double bonds, alkyne groups with single or multi carbon to carbon triple bonds, primary amine groups, secondary amino groups, tertiary amino groups, cationic organic quaternary ammonium groups, —COOH, —SO$_3$H, —H$_2$PO$_4$, —COOR', —COOM (M=Na+, K+ or NH$_4$+), —SO$_3$M (M=Na+, K+ or NH$_4$+), —HPO$_4$M (M=Na+, K+ or NH$_4$+), —PO$_4$M$_2$ (M=Na+, K+ or NH$_4$+), and combinations thereof;
(e)

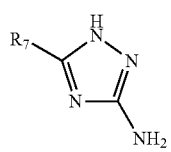

wherein
R$_7$ can be present or not present; R$_7$ is selected from the group consisting of alkyl groups with straight chain or branched chain, alkoxy groups with straight chain or branched chain, alkene groups with single or multi carbon to carbon double bonds, alkyne groups with single or multi carbon to carbon triple bonds, primary amine groups, secondary amino groups, tertiary amino groups, cationic organic quaternary ammonium groups, —COOH, —SO$_3$H, —H$_2$PO$_4$, —COOR', —COOM (M=Na+, K+ or NH$_4$+), —SO$_3$M (M=Na+, K+ or NH$_4$+), —HPO$_4$M (M=Na+, K+ or NH$_4$+), —PO$_4$M$_2$ (M=Na+, K+ or NH$_4$+), and combinations thereof; and
combinations thereof.

When R$_1$ is a hydrogen atom and R$_2$ is not present in structure (a), the organic aromatic heterocyclic compound is benzotriazole.

When R$_1$ is an organic function group other than hydrogen atom, and R$_2$ is another organic functional group attached at any positions of -4, -5, 6, or -7 on benzene ring in structure (a), the organic aromatic heterocyclic compound is a derivative molecule of benzotriazole.

When R$_3$ is a hydrogen atom and R$_4$ is not present in structure (b), the organic aromatic heterocyclic compound is 2-aminobenzimidazole.

When R$_3$ is an organic function group other than hydrogen atom, and R$_4$ is another organic functional group attached at any positions of -4, -5, 6, or -7 on benzene ring in structure (b), the organic aromatic heterocyclic compound is a derivative molecule of 2-aminobenzimidazole.

When R$_5$ is not present in structure (c), the organic aromatic heterocyclic compound is 1,2,3-triazole.

When R$_5$ is an organic function group attached at any positions of -4 or -5 on 1,2,3-triazole ring in structure (c), the organic aromatic heterocyclic compound is a derivative molecule of 1,2,3-triazole.

When R$_6$ is not present in structure (d), the organic aromatic heterocyclic compound is 1,2,4-triazole.

When R$_6$ is an organic function group attached at any positions of -3, or -5 on 1,2,4-triazole ring in structure (d), the organic aromatic heterocyclic compound is a derivative molecule of 1,2,4-triazole.

When R$_7$ is not present in structure (e), the organic aromatic heterocyclic compound is 3-amino-1,2,4-triazole or amitrole.

When R$_7$ is an organic function group attached at position -5 on 3-amino-1,2,4-triazole ring in structure (e), the organic aromatic heterocyclic compound is a derivative molecule of 3-amino-1,2,4-triazole.

The organic aromatic heterocyclic compound with nitrogen atoms as hetero atoms in the molecules includes, but is not limited to benzotriazole and its derivatives, 2-aminobenzimidazole and its derivatives, amitrole and its derivatives, triazole and its derivatives, and combinations thereof.

The preferred the first type of chemical additives include, but are not limited to, organic aromatic heterocyclic compounds with nitrogen atoms as hetero atoms in these molecules, for examples, benzotriazole and its derivatives, 2-aminobenzimidazole and its derivatives, amitrole and its derivatives, triazole and its derivatives.

The Type II of chemical additives are at least one nonionic organic molecule having more than one hydroxyl functional group having a general molecular structure selected from the group consisting of

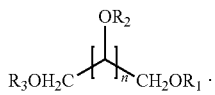

(a)

In the general molecular structure (a), n is selected from 2 to 5,000, preferably from 3 to 12, and more preferably from 4 to 6.

In these general molecular structures; $R_1$, $R_2$, and $R_3$ groups can be the same or different atoms or functional groups.

$R_1$, $R_2$, and $R_3$ can be independently selected from the group consisting of hydrogen, an alkyl group $C_nH_{2n+1}$, n is from 1 to 12, preferably 1 to 6, and more preferably 1 to 3; alkoxy, organic group with one or more hydroxyl groups, substituted organic sulfonic acid, substituted organic sulfonic acid salt, substituted organic carboxylic acid, substituted organic carboxylic acid salt, organic carboxylic ester, organic amine groups, and combinations thereof; wherein, at least two are hydrogen atoms.

In another embodiment, the Type II chemical additive has a general structure shown below:

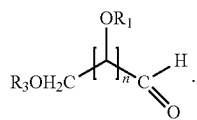

(b)

In this structure, one —CHO functional group is located at one end of the molecule as the terminal functional group; n is selected from 2 to 5,000, from 3 to 12, and preferably from 4 to 7.

Each of $R_1$ and $R_2$ can be independently selected from the group consisting of hydrogen, alkyl, alkoxy, organic group with one or more hydroxyl groups, substituted organic sulfonic acid, substituted organic sulfonic acid salt, substituted organic carboxylic acid, substituted organic carboxylic acid salt, organic carboxylic ester, organic amine groups, and combinations thereof.

In yet another embodiment, the chemical additives of Type II has a molecular structure selected from the group comprising of at least one (c), at least one (d), at least one (e) and combinations thereof;

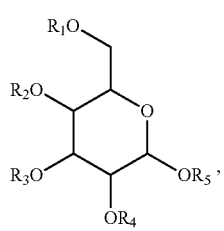

(c)

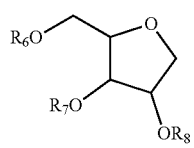

(d)

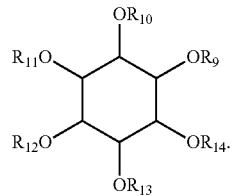

(e)

In these general molecular structures; $R_1$, $R_2$, $R_3$, $R_4$, $R_5$, $R_6$, $R_7$, $R_8$, $R_9$, $R_{10}$, $R_{11}$, $R_{12}$, $R_{13}$, and $R_{14}$ can be the same or different atoms or functional groups.

They can be independently selected from the group consisting of hydrogen, alkyl, alkoxy, organic group with one or more hydroxyl groups, substituted organic sulfonic acid, substituted organic sulfonic acid salt, substituted organic carboxylic acid, substituted organic carboxylic acid salt, organic carboxylic ester, organic amine groups, and combinations thereof; wherein, at least two or more, preferably four or more of them are hydrogen atoms.

Yet, in another embodiment, the Type II chemical additives contain at least one six-member ring structure motif ether bonded with at least one polyol molecular unit containing multiple hydroxyl functional groups in the molecular unit structures or at least one polyol molecular unit containing multiple hydroxyl functional groups in the molecular unit structures and at least one six-member ring polyol. A polyol is an organic compound containing hydroxyl groups.

The general molecular structure for the chemical additives is shown in (f):

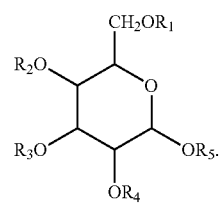

(f)

In structure (f), at least one R in the group of $R_1$ to $R_5$ in the general molecular structure (f) is a polyol molecular unit having a structure shown in (i):

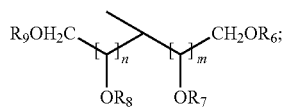

(i)

wherein n and m can be the same or different. m or n is independently selected from 1 to 5, preferably from 1 to 4, more preferably from 1 to 3, and most preferably from 1 to 2; $R_6$ to $R_9$ can be the same or different atoms or functional groups; each of $R_6$, $R_7$, $R_8$, and $R_9$ is independently selected from the group consisting of hydrogen, alkyl, alkoxy, organic group with one or more hydroxyl groups, substituted organic sulfonic acid, substituted organic sulfonic acid salt, substituted organic carboxylic acid, substituted organic carboxylic acid salt, organic carboxylic ester, organic amine, and combinations thereof; and at least two of them are hydrogen atoms; and the rest of each R in the group of $R_1$ to $R_5$ can be independently selected from the group consisting of hydrogen, alkyl, alkoxy, organic group with one or more hydroxyl groups, substituted organic sulfonic acid or salt, substituted organic carboxylic acid or salt, organic carboxylic ester, organic amine, a six-member ring polyol having a structure shown in (ii):

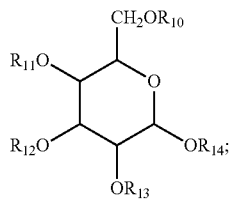

wherein the structure (ii) is connected through oxygen carbon bond to structure (f) by removing one R from $R_{11}$ to $R_{14}$ in (ii) and each of the rest $R_{10}$ to $R_{14}$ is independently selected from the group consisting of hydrogen, alkyl, alkoxy, organic group with one or more hydroxyl groups, substituted organic sulfonic acid or salt, substituted organic carboxylic acid or salt, organic carboxylic ester, organic amine, and combinations thereof; and combinations thereof.

In some embodiments, the general molecular structure (f) has at least two, at least four, or at least six of the Rs in the group of $R_1$ to $R_9$ are hydrogen atoms. Thus, the chemical additives contain at least two, at least four, or at least six hydroxyl functional groups in their molecular structures.

Examples of Type II chemical additives comprise maltitol, lactitol, maltotritol, ribitol, D-sorbitol, mannitol, dulcitol, iditol, D-(−)-Fructose, sorbitan, sucrose, ribose, Inositol, glucose, D-arabinose, L-arabinose, D-mannose, L-mannose, meso-erythritol, beta-lactose, arabinose, and combinations thereof. The preferred chemical additives are maltitol, lactitol, maltotritol, D-sorbitol, mannitol, dulcitol, iditol, D-(−)-Fructose, sucrose, ribose, Inositol, glucose. D-(+)-mannose, beta-lactose, and combinations thereof. The more preferred chemical additives are maltitol, lactitol, maltotritol, D-sorbitol, mannitol, dulcitol, D-(−)-Fructose, beta-lactose, and combinations thereof.

In some embodiments, the CMP polishing compositions can be made into two or more components and mixed at the point of use.

Some examples of Type II chemical additives are listed below:

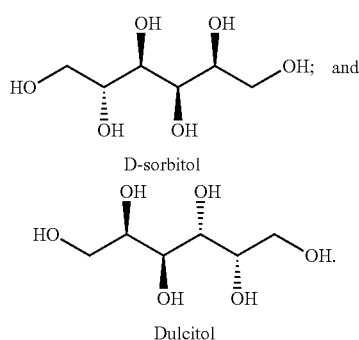

D-sorbitol

Dulcitol

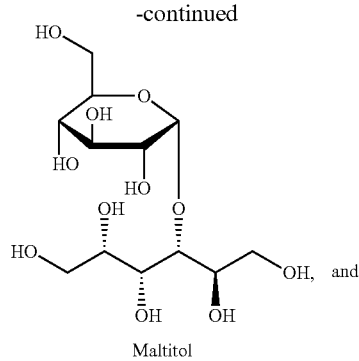

Maltitol

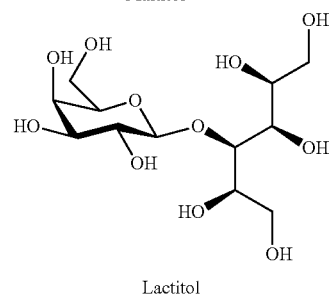

Lactitol

The preferred first type chemical additives are benzotriazole and its derivatives, 2-aminobenzimidazole and its derivatives, amitrole and its derivatives, triazole and its derivatives.

The preferred second type chemical additives are D-sorbitol, Dulcitol, Maltitol, and Lactitol.

In another aspect, there is provided a method of chemical mechanical polishing (CMP) a substrate having at least one surface comprising silicon dioxide using the chemical mechanical polishing (CMP) composition described above in Shallow Trench Isolation (STI) process.

In yet another aspect, there is provided a system of chemical mechanical polishing (CMP) a substrate having at least one surface comprising silicon dioxide using the chemical mechanical polishing (CMP) composition described above in Shallow Trench Isolation (STI) process.

The polished oxide films can be Chemical Vapor Deposition (CVD), Plasma Enhance CVD (PECVD), High Density Deposition CVD(HDP), or spin on oxide films.

The substrate disclosed above can further comprises a silicon nitride surface. The removal selectivity of $SiO_2$:SiN is tunable depending on the STI CMP application requirements.

The following non-limiting examples are presented to further illustrate the present invention.

EXAMPLES

CMP Methodology

In the examples presented below, CMP experiments were run using the procedures and experimental conditions given below.

GLOSSARY/COMPONENTS

Ceria-coated Silica: used as abrasive having a particle size of approximately 100 nanometers (nm); such ceria-coated silica particles can have a particle size of ranged from approximately 20 nanometers (nm) to 500 nanometers (nm);

Ceria-coated Silica particles (with varied sizes) were supplied by JGCC Inc. in Japan.

Chemical additives, such as the nitrogen-containing aromatic heterocyclic compounds such as, for example, benzotriazole and its derivatives, 2-aminobenzimidazole and its derivatives, amitrole and its derivatives, triazole and its derivatives etc., maltitol, D-Fructose, Dulcitol, D-sorbitol and other chemical raw materials were supplied by Sigma-Aldrich, St. Louis, Mo., or supplied by Evonik Industries in Allentown, Pa.

TEOS: tetraethyl orthosilicate

Polishing Pad: Polishing pad, IC1010 and other pads were used during CMP, supplied by DOW, Inc.

Parameters

General

Å or A: angstrom(s)—a unit of length

BP: back pressure, in psi units

CMP: chemical mechanical planarization=chemical mechanical polishing

CS: carrier speed

DF: Down force: pressure applied during CMP, units psi min: minute(s)

ml: milliliter(s)

mV: millivolt(s)

psi: pounds per square inch

PS: platen rotational speed of polishing tool, in rpm (revolution(s) per minute)

SF: composition flow, ml/min

Wt. %: weight percentage (of a listed component)

TEOS: SiN Selectivity: (removal rate of TEOS)/(removal rate of SiN)

HDP: high density plasma deposited TEOS

TEOS or HDP Removal Rates: Measured TEOS or HDP removal rate at a given down pressure. The down pressure of the CMP tool was 3.1 psi in the examples listed below.

SiN Removal Rates: Measured SiN removal rate at a given down pressure. The down pressure of the CMP tool was 3.1 psi in the examples listed below.

Metrology

Films were measured with a ResMap CDE, model 168, manufactured by Creative Design Engineering, Inc, 20565 Alves Dr., Cupertino, Calif., 95014. The ResMap tool is a four-point probe sheet resistance tool. Forty-nine-point diameter scan at 5 mm edge exclusion for film was taken.

CMP Tool

The CMP tool that was used is a 200 mm Mirra, or 300 mm Reflexion manufactured by Applied Materials, 3050 Boweres Avenue, Santa Clara, Calif., 95054. An IC1000 pad supplied by DOW, Inc, 451 Bellevue Rd., Newark, Del. 19713 was used on platen 1 for blanket and pattern wafer studies.

The IC1010 pad was broken in by conditioning the pad for 18 mins. At 7 lbs. down force on the conditioner. To qualify the tool settings and the pad break-in two tungsten monitors and two TEOS monitors were polished with Versum® STI2305 composition, supplied by Versum Materials Inc. at baseline conditions.

Wafers

Polishing experiments were conducted using PECVD or LECVD or HD TEOS wafers. These blanket wafers were purchased from Silicon Valley Microelectronics, 2985 Kifer Rd., Santa Clara, Calif. 95051.

Polishing Experiments

In blanket wafer studies, oxide blanket wafers, and SiN blanket wafers were polished at baseline conditions. The tool baseline conditions were: table speed; 87 rpm, head speed: 93 rpm, membrane pressure; 3.1 psi DF, slurry flow rate: 200 ml/min.

The composition was used in polishing experiments on patterned wafers (MIT860), supplied by SWK Associates, Inc. 2920 Scott Blvd. Santa Clara, Calif. 95054). These wafers were measured on the Veeco VX300 profiler/AFM instrument. The 3 different sized pitch structures were used for oxide dishing measurement. The wafer was measured at center, middle, and edge die positions.

TEOS: SiN Selectivity: (removal rate of TEOS)/(removal rate of SiN) obtained from the STI CMP polishing compositions were tunable.

In the following working examples, a STI polishing composition comprising 0.2 wt. % ceria-coated silica, a biocide ranging from 0.0001 wt. % to 0.05 wt. %, 0.188 wt. % D-sorbitol and deionized water was prepared as reference at pH 5.35.

The polishing working compositions were prepared using various wt. % ceria-coated silica, various wt. % D-sorbitol, a biocide ranging from 0.0001 wt. % to 0.05 wt. %, various wt. % of organic heterocyclic aromatic compounds, and deionized water at same or at different pH conditions.

Example 1

In Example 1, the polishing compositions used for oxide polishing were shown in Table 1.

The working samples were made using 0.2 wt. % ceria-coated silica, a biocide ranging from 0.0001 wt. % to 0.05 wt. %, 0.188 wt. % D-sorbitol, various wt. % of 2-aminobenzimidazole or 0.05 wt. % amitrole respectively, and deionized water at pH 5.35.

The removal rates (RR at Å/min) for different films were tested. The effects of dual chemical additives, D-sorbitol and 2-Aminobenzimidazole or D-sorbitol and amitrole on the film removal rates were observed and listed in Table 1.

TABLE 1

Effects of dual chemical additives on film RR (Å/min.)

| Compositions | TEOS RR (Å/min.) | HDP RR (Å/min.) | PECVD SiN RR (Å/min.) | LPCVD SiN RR (Å/min.) |
| --- | --- | --- | --- | --- |
| 0.2% Ceria-coated Silica + 0.188% D-Sorbitol Ref. | 2057 | 2580 | 74 | 39 |
| Ref. + 0.01% 2-Aminobenzimidazole | 3360 | 3524 | 127 | 152 |
| Ref. + 0.0125% 2-Aminobenzimidazole | 3134 | 3390 | 138 | 169 |

TABLE 1-continued

Effects of dual chemical additives on film RR (Å/min.)

| Compositions | TEOS RR (Å/min) | HDP RR (Å/min.) | PECVD SiN RR (Å/min) | LPCVD SiN RR (Å/min) |
|---|---|---|---|---|
| Ref. + 0.015% 2-Aminobenzimidazole | 2807 | 3176 | 128 | 169 |
| Ref. + 0.05% Amitrole | 4044 | 4033 | 124 | 90 |

As the results shown in Table 1, the additions of 2-Aminobenzimidazole at different concentrations or amitrole into the polishing composition to have dual chemical additives polishing compositions effectively boosted both PECVD and LPCVD SiN film removal rates.

With dual chemical additives in the polishing compositions, high and desirable TEOS and HDP film removal rates were obtained.

TABLE 2

Boosting Effects of Dual Chemical Additives on SiN RR (Å/min.)

| Compositions | PECVD SiN RR (Å/min) | PECVD SiN RR Change % | LPCVD SiN RR (Å/min) | LPCVD SiN RR Change % |
|---|---|---|---|---|
| 0.2% Ceria-coated Silica + 0.188% D-Sorbitol Ref. | 74 | | 39 | |
| Ref. + 0.01% 2-Aminobenzimidazole | 127 | +71.6% | 152 | +389.7% |
| Ref. + 0.0125% 2-Aminobenzimidazole | 138 | +86.5% | 169 | +433.3% |
| Ref. + 0.015% 2-Aminobenzimidazole | 128 | +73.0% | 169 | +433.3% |
| Ref. + 0.05% Amitrole | 124 | +67.6% | 90 | +230.8% |

The boosting effects on increasing PECVD SiN and LPCVD SiN film removal rates using 2-Aminobenzimidazole or amitrole to form dual chemical additive based polishing compositions were listed in Table 2.

As the results shown in Table 2, the additions of 2-Aminobenzimidazole at different concentrations or amitrole into the polishing composition to form dual chemical additives based polishing composition effectively boosted both PECVD and LPCVD SiN film removal rates by significant percentage which made the SiN film removal rates tunable.

Example 2

In Example 2, the polishing compositions used for oxide polishing were shown in Table 3.

TABLE 3

Effects of Dual Additive Polishing Compositions on Oxide Trench Dishing (Å) vs OP Times (Sec.)

| Compositions | OP Times (Sec.) | 100 um pitch dishing | 200 um pitch dishing |
|---|---|---|---|
| 0.2% Ceria-coated Silica + 0.188% D-Sorbitol Ref. | 0 | 161 | 360 |
| | 60 | 284 | 393 |
| | 120 | 393 | 468 |
| Ref. + 0.01% 2-Aminobenzimidazole | 0 | 116 | 248 |
| | 60 | 287 | 395 |
| | 120 | 425 | 555 |
| Ref. + 0.0125% 2-Aminobenzimidazole | 0 | 119 | 264 |
| | 60 | 308 | 446 |
| | 120 | 433 | 627 |
| Ref. + 0.015% 2-Aminobenzimidazole | 0 | 66 | 180 |
| | 60 | 270 | 383 |
| | 120 | 397 | 541 |
| Ref. + 0.05% Amitrole | 0 | 84 | 215 |
| | 60 | 199 | 330 |
| | 120 | 340 | 490 |

The working samples were made using 0.2 wt. % ceria-coated silica, a biocide ranging from 0.0001 wt. % to 0.05 wt. %, 0.188 wt. % D-sorbitol, various wt. % of 2-Aminobenzimidazole or 0.05 wt. % Amitrole respectively, and deionized water at pH 5.35

The effects of using 2-Aminobenzimidazole at different wt. % or 0.05 wt. % Amitrole to form dual additives based polishing compositions on the oxide trenching dishing vs different over polishing times were tested and the results were listed in Table 3.

As the results shown in Table 3, the addition of 2-Aminobenzimidazole at various wt. % or 0.05 wt. % amitrole to form dual additives based polishing compositions maintained similar oxide trench dishing vs different over polishing times while comparing the reference sample which only used ceria-coated silica abrasives and 0.188 wt. % D-sorbitol.

The effects of adding 2-Aminobenzimidazole at different wt. % or 0.05 wt. % Amitrole to form dual additives based polishing compositions on the oxide trenching dishing rate were tested and the results were listed in Table 4.

TABLE 4

Effects of Dual Additives at pH 5.35 on Oxide Dishing Rate

| Compositions | P100 Dishing (Å/sec.) | P200 Dishing (Å/sec.) |
|---|---|---|
| 0.2% Ceria-coated Silica + 0.188% D-Sorbitol Ref. | 1.9 | 2.0 |
| Ref. + 0.01% 2-Aminobenzimidazole | 2.6 | 2.6 |
| Ref. + 0.0125% 2-Aminobenzimidazole | 2.6 | 3.0 |
| Ref. + 0.015% 2-Aminobenzimidazole | 2.8 | 3.0 |
| Ref. + 0.05% Amitrole | 2.1 | 2.3 |

As the results shown in Table 4, the addition of 2-Aminobenzimidazole at various wt. % or 0.05 wt. % amitrole to form dual additives based polishing compositions maintained similar oxide dishing rates while comparing the reference sample which only used ceria-coated silica abrasives and 0.188 wt. % D-sorbitol.

The effects the addition of 2-Aminobenzimidazole at various wt. % or 0.05 wt. % amitrole to form dual additives based polishing compositions on the slopes of oxide trenching dishing vs over polishing amounts were tested and the results were listed in Table 5.

TABLE 5

Effects of Dual Additives on the Slopes of Trench Dishing vs Over Polishing Amounts

| Compositions | P100 Dishing/OP Amt. Slope | P200 Dishing/OP Amt. Slope |
|---|---|---|
| 0.2% Ceria-coated Silica + 0.188% D-Sorbitol Ref. | 0.04 | 0.02 |
| Ref. + 0.01% 2-Aminobenzimidazole | 0.04 | 0.04 |
| Ref. + 0.0125% 2-Aminobenzimidazole | 0.05 | 0.05 |
| Ref. + 0.015% 2-Aminobenzimidazole | 0.05 | 0.06 |
| Ref. + 0.05% Amitrole | 0.03 | 0.03 |

As the results shown in Table 5, the addition of 2-Aminobenzimidazole at various wt. % or 0.05 wt. % amitrole to form dual additives based polishing compositions maintained very low and similar slopes of oxide dishing vs over polishing amounts while comparing the reference sample which only used one additive 0.188 wt. % D-sorbitol.

Example 3

In Example 3, the polishing compositions used for oxide polishing were shown in Table 6.

The working samples were made using 0.2 wt. % ceria-coated silica, a biocide ranging from 0.0001 wt. % to 0.05 wt. %, 0.15 wt. % D-sorbitol, 0.025 wt. % of 2-Aminobenzimidazole or 0.05 wt. % Amitrole respectively, and deionized water at different pH conditions.

The effects of adding 2-Aminobendimidazole to form dual additives based polishing compositions at different pH conditions on various film removal rates were tested and the results were listed in Table 6.

As the results shown in Table 6, the additions of 2-Aminobenzimidazole to form dual additives based polishing compositions at different pH affected all film removal rates.

TABLE 6

Effects of Dual Additives on Film RRs at Different pH

| Compositions | TEOS RR (Å/min) | HDP RR (Å/min.) | PECVD SiN RR (Å/min) | LPCVD SiN RR (Å/min) |
|---|---|---|---|---|
| 0.2% Ceria-coated Silica + 0.15% D-Sorbitol Ref. pH 5.35 | 3271 | 3204 | 64 | 46 |
| Ref. + 0.025% 2-Aminobenzimidazole pH 5.35 | 2067 | 2593 | 108 | 99 |
| Ref. + 0.025% 2-Aminobenzimidazole pH 6.5 | 2125 | 2774 | 100 | 77 |
| Ref. + 0.025% 2-Aminobenzimidazole pH 7.5 | 1503 | 2376 | 49 | 54 |

Both TEOS and HDP film removal rates were reduced using the dual additives based polishing compositions while comparing with the TEOS and HDP film removal rates obtained for reference sample without using dual additives.

Both PECVD and LPCVD SiN film removal rates were boosted significantly at pH between 5.35 and 6.5, but no or little boosting effect on SiN removal rates were observed at pH 7.5.

Example 4

In Example 4, the polishing compositions used for oxide polishing were shown in Table 7.

The reference sample was made using 0.2 wt. % ceria-coated silica, a biocide ranging from 0.0001 wt. % to 0.05 wt. %, 0.15 wt. % D-sorbitol at pH 5.35. The working samples were made using 0.2 wt. % ceria-coated silica, a biocide ranging from 0.0001 wt. % to 0.05 wt. %, 0.15 wt. % D-sorbitol, 0.025 wt. % of 2-Aminobenzimidazole or 0.05 wt. % Amitrole respectively, and deionized water at different pH conditions.

The polishing step conditions used were: Dow's IC1010 pad at 3.1 psi DF with table/head speed at 87/93 rpm and ex-situ conditioning.

The effects of adding 2-Aminobenzimidazole at 0.025 wt. % to form dual additive polishing compositions on the oxide trenching dishing vs different over polishing times at different pH conditions were tested and the results were listed in Table 7.

TABLE 7

Effects of Dual Additives at Different pH on Oxide Trench Dishing (Å) vs OP Times (Sec.)

| Compositions | OP Times (Sec.) | 100 um pitch dishing | 200 um pitch dishing |
|---|---|---|---|
| 0.2% Ceria-coated Silica + 0.15% D-Sorbitol Ref. pH 5.35 | 0 | 92 | 206 |
| | 60 | 208 | 345 |
| | 120 | 316 | 470 |
| Ref. + 0.025% 2-Aminobenzimidazole pH 5.35 | 0 | 84 | 190 |
| | 60 | 302 | 452 |
| | 120 | 462 | 647 |
| Ref. + 0.025% 2-Aminobenzimidazole pH 6.5 | 0 | 66 | 200 |
| | 60 | 298 | 438 |
| | 120 | 452 | 665 |
| Ref. + 0.025% 2-Aminobenzimidazole pH 7.5 | 0 | 86 | 217 |
| | 60 | 155 | 303 |
| | 120 | 301 | 451 |

As the results shown in Table 7, the addition of 2-Aminobenzimidazole at 0.025 wt. % to form dual additive polishing compositions maintained low and similar oxide trench dishing vs different over polishing times while comparing with the reference sample which only used ceria-coated silica abrasives and one additive 0.15 wt. % D-sorbitol at pH 5.35.

TABLE 8

Effects of Dual Additives at Different pH on Oxide Dishing Rate

| Compositions | P100 Dishing (Å/sec.) | P200 Dishing (Å/sec.) |
|---|---|---|
| 0.2% Ceria-coated Silica + 0.15% D-Sorbitol Ref. pH 5.35 | 1.9 | 2.2 |
| Ref. + 0.025% 2-Aminobenzimidazole pH 5.35 | 3.2 | 3.8 |
| Ref. + 0.025% 2-Aminobenzimidazole pH 6.5 | 3.2 | 3.9 |
| Ref. + 0.025% 2-Aminobenzimidazole pH 7.5 | 1.8 | 2.0 |

The effects of adding 2-Aminobenzimidazole at 0.025 wt. % to form dual additive polishing compositions at different pH conditions on the oxide trenching dishing rate were tested and the results were listed in Table 8.

As the results shown in Table 8, the addition of 2-Aminobenzimidazole at 0.025 wt. % to form dual additive polishing compositions had slightly higher oxide dishing rates at pH 5.35 or 6.5, and slightly lower oxide trench dishing rates at pH 7.5 while comparing with the reference sample which only used ceria-coated silica abrasives, and one additive 0.15 wt. % D-sorbitol.

The effects of adding 2-Aminobenzimidazole at 0.025 wt. % to form dual additive polishing compositions on the slopes of oxide trenching dishing vs over polishing amounts were tested and the results were listed in Table 9.

TABLE 9

Effects of dual additives at Different pH on the Slopes of Trench Dishing vs Over Polishing Amounts

| Compositions | P100 Dishing/OP Amt. Slope | P200 Dishing/OP Amt. Slope |
|---|---|---|
| 0.2% Ceria-coated Silica + 0.15% D-Sorbitol Ref. pH 5.35 | 0.03 | 0.04 |
| Ref. + 0.025% 2-Aminobenzimidazole pH 5.35 | 0.07 | 0.09 |
| Ref. + 0.025% 2-Aminobenzimidazole pH 6.5 | 0.07 | 0.08 |
| Ref. + 0.025% 2-Aminobenzimidazole pH 7.5 | 0.05 | 0.05 |

As the results shown in Table 9, the addition of 2-Aminobenzimidazole at 0.025 wt. % to form dual additive polishing compositions had higher slopes of oxide trench dishing at pH 5.35 and at pH 6.5 conditions but remained similar slope values at pH of 7.5 comparing with the reference sample which only used ceria-coated silica abrasives and 0.15 wt. % D-sorbitol.

The embodiments of this invention listed above, including the working example, are exemplary of numerous embodiments that may be made of this invention. It is contemplated that numerous other configurations of the process may be used, and the materials used in the process may be elected from numerous materials other than those specifically disclosed.

The invention claimed is:

1. A chemical mechanical polishing composition comprising:
    at least one ceria-coated inorganic oxide particles;
    at least one nitrogen-containing aromatic heterocyclic compound selected from the group consisting of benzotriazole, 2-aminobenzimidazole, 1,2,3-triazole, 1,2,4-triazole, 3-amino-1,2,4-triazole or amitrole, and combinations thereof;
    at least one non-ionic organic molecule having more than one hydroxyl functional group selected from the group consisting of D-sorbitol, mannitol, dulcitol, ribitol, iditol, meso-erythritol, maltotritol, lactitol, maltitol, sorbitan, and combinations thereof;
    at least one solvent; and
    optionally, a biocide; and
    optionally, at least one a pH adjuster, wherein the composition has a pH of from 2 to 12.

2. The chemical mechanical polishing composition of claim 1 wherein the pH is from 3 to 10.

3. The chemical mechanical polishing composition of claim 2 wherein the pH is from 4 to 9.

4. The chemical mechanical polishing composition of claim 1, wherein the ceria-coated inorganic oxide particles are at least one selected from the group consisting of ceria-coated colloidal silica, ceria-coated high purity colloidal silica, ceria-coated alumina, ceria-coated titania, ceria-coated zirconia particles and combinations thereof, wherein the particles are present in the composition at range selected from the group consisting of from 0.01 wt. % to 20 wt. %.

5. The chemical mechanical polishing composition of claim 4, wherein the ceria-coated inorganic oxide particles are present in the composition at range of from 0.05 wt. % to 10 wt. %.

6. The chemical mechanical polishing composition of claim 5, wherein the ceria-coated inorganic oxide particles are present in the composition at range of from 0.1 wt. % to 5 wt. %.

7. The chemical mechanical polishing composition of claim 1, wherein the ceria-coated inorganic oxide particles are at least one selected from the group consisting of ceria-coated colloidal silica, ceria-coated high purity colloidal silica, ceria-coated alumina, ceria-coated titania, ceria-coated zirconia particles and combinations thereof, wherein the concentration of the particles are present at a concentration range selected from the group consisting of from 0.01 wt. % to 2.00 wt. %.

8. The chemical mechanical polishing composition of claim 1, wherein the at least one solvent is selected from the group consisting of deionized (DI) water, distilled water, and an alcohol-containing organic solvent.

9. The chemical mechanical polishing composition of claim 1, wherein the at least one non-ionic organic molecule having more than one hydroxyl functional group is present in the composition at a concentration ranging selected from the group consisting of from 0.001 wt. % to 2.0% wt. %; and is selected from the group consisting of D-sorbitol, mannitol, dulcitol, ribitol, iditol, meso-erythritol and combinations thereof.

10. The chemical mechanical polishing composition of claim 1, wherein the composition further comprises from 0.0001 wt. % to 0.05 wt. % of the biocide, wherein the biocide comprises 5-chloro-2-methyl-4-isothiazolin-3-one and 2-methyl- -isothiazolin-3-one.

11. The chemical mechanical polishing composition of claim 1, wherein the composition further comprises from 0 wt. % to 1 wt. % of the pH adjusting agent wherein the pH adjusting agent is selected from the group consisting of nitric acid, hydrochloric acid, sulfuric acid, phosphoric acid, other inorganic or organic acids, and mixtures thereof for acidic pH conditions; or selected from the group consisting of sodium hydride, potassium hydroxide, ammonium hydroxide, tetraalkyl ammonium hydroxide, organic quaternary ammonium hydroxide compounds, organic amines, and combinations thereof for alkaline pH conditions.

12. The chemical mechanical polishing composition of claim 1, comprising ceria-coated colloidal silica, the at least one nitrogen-containing aromatic heterocyclic compound is selected from the group consisting of benzotriazole and its derivatives, 2-aminobenzimidazole and its derivatives, amitrole and its derivatives, triazole and its derivatives, and combinations thereof; and the at least one non-ionic organic molecule having more than one hydroxyl functional group is selected from the group consisting of Dulcitol, D-sorbitol, Maltitol, Lactitol, and combinations thereof.

13. A method of chemical mechanical polishing (CMP) a semiconductor substrate having at least one surface comprising a silicon oxide film, the method comprising the steps of:
providing the semiconductor substrate;
providing a polishing pad;
providing the chemical mechanical polishing (CMP) composition of claim 1;
contacting the surface of the semiconductor substrate with the polishing pad and the chemical mechanical polishing composition; and
polishing the least one surface comprising silicon dioxide.

14. The method of claim 13, wherein the silicon oxide film is $SiO_2$.

15. The method of claim 13, wherein the semiconductor substrate further comprises a silicon nitride surface.

16. A system of chemical mechanical polishing (CMP) a semiconductor substrate having at least one surface comprising silicon oxide, the system comprising:
a. a semiconductor substrate;
b. the chemical mechanical polishing (CMP) composition of claim 1;
c. a polishing pad,
wherein the at least one surface comprising silicon oxide film is in contact with the polishing pad and the chemical mechanical polishing composition.

17. The system of claim 16; wherein the silicon oxide film is $SiO_2$.

18. The system of claim 16; wherein the semiconductor substrate further comprises a silicon nitride surface.

* * * * *